United States Patent
Freer et al.

(10) Patent No.: US 10,230,232 B2
(45) Date of Patent: Mar. 12, 2019

(54) AUTOMATED GROUND FAULT INTERRUPT TESTER

(71) Applicant: Cooper Technologies Company, Houston, TX (US)

(72) Inventors: Benjamin Avery Freer, Syracuse, NY (US); Stephan P. Iannce, Clay, NY (US); Joseph Michael Manahan, Manlius, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 345 days.

(21) Appl. No.: 15/271,719

(22) Filed: Sep. 21, 2016

(65) Prior Publication Data
US 2017/0093147 A1   Mar. 30, 2017

Related U.S. Application Data

(60) Provisional application No. 62/233,690, filed on Sep. 28, 2015.

(51) Int. Cl.
*H02H 3/17* (2006.01)
*H02H 3/16* (2006.01)
*G01R 31/02* (2006.01)
*H02H 3/33* (2006.01)

(52) U.S. Cl.
CPC .......... *H02H 3/162* (2013.01); *G01R 31/025* (2013.01); *H02H 3/17* (2013.01); *H02H 3/335* (2013.01)

(58) Field of Classification Search
CPC .......... H02H 3/162; H02H 3/17; H02H 3/335; G01R 31/025
See application file for complete search history.

(56) References Cited

U.S. PATENT DOCUMENTS

| 4,208,688 | A | 6/1980 | Misencik et al. |
| 6,744,260 | B2 | 6/2004 | Schmalz et al. |
| 7,936,543 | B2 * | 5/2011 | Restrepo ................. H02H 3/335 324/110 |
| 8,779,775 | B2 * | 7/2014 | Sexton ...................... H02H 3/38 324/539 |
| 2005/0237680 | A1 | 10/2005 | Egner |
| 2006/0209483 | A1 | 9/2006 | Hurwicz |
| 2012/0250193 | A1 * | 10/2012 | Kevelos ................. H02H 3/044 361/45 |

(Continued)

OTHER PUBLICATIONS

International Search Report for International Application No. PCT/US2016/053544 dated Jan. 6, 2017.

*Primary Examiner* — Scott Bauer
(74) *Attorney, Agent, or Firm* — Merchant & Gould P.C.

(57) ABSTRACT

A system includes a hot wire and a neutral wire configured to establish a closed circuit between a power source and a load. The system further includes first and second transformers as well as a sensor. The first current transformer is coupled to the hot wire and is configured to introduce a first test current, with a first polarity, into the hot wire. The second current transformer is coupled to the neutral wire and configured to substantially simultaneously introduce a second test current into the neutral wire. The second test current has the same polarity as the first test current. The sensor is configured to sense an asymmetry between the first and second test currents and is further configured to cause interruption of the closed circuit upon sensing the asymmetry.

20 Claims, 4 Drawing Sheets

(56) References Cited

U.S. PATENT DOCUMENTS

2013/0193998 A1 8/2013 Tang et al.
2014/0197856 A1* 7/2014 Ostrovsky .......... G01R 31/3277
　　　　　　　　　　　　　　　　　　　　324/750.3

* cited by examiner

AUTOMATED GROUND FAULT INTERRUPT TESTER

CROSS REFERENCE TO RELATED APPLICATION

This application claims the benefit of U.S. Provisional Application No. 62/233,690, filed Sep. 28, 2015, which is incorporated herein by reference in its entirety.

FIELD OF THE DISCLOSURE

The present disclosure generally relates to ground fault circuits and, more particularly, to automating the testing of ground fault circuits.

BACKGROUND OF THE DISCLOSURE

Ground fault circuit interrupters (GFCIs) are designed to protect individuals from electrical shock by interrupting the operation of circuit that is connected to a load. In a typical GFCI circuit configuration, a three-wire configuration is used to establish a circuit with the load including a hot wire that delivers a current to the load, a neutral wire that returns the current, and a ground wire. In standard operation, the current on the hot wire will match the current on the neutral wire. However, a difference in current between the two wires indicates that an abnormal diversion of current from the hot wire is occurring. That diverted current has a return path to ground rather than through the neutral, i.e., a ground fault has occurred. Ground faults are an indication of undesired, faulty and/or unsafe use of equipment, as properly designed equipment will always use the neutral as a return path. Thus, upon the occurrence of a ground fault, the GFCI in the circuit will break the circuit to prevent shock to someone coming in contact with a hot wire. Ground fault is generally below 5 mA for human protection, but heat tracing operates on the same principle and used for equipment protection at 30 mA.

Important in the maintenance of GFCIs is the periodic testing of the GFCI; the NFPA (National Fire Protection Association) prescribes monthly testing. In a residential setting, a GFCI may be easily tested by activating the "test" switch on a GFCI outlet then returned to normal operation by activating the "reset" switch. However, in industrial situations, most particularly in Class I, Division 1 or 2 environments, where GFCIs are provided for improved safety, periodic testing of the GFCI is not as easily performed. Often the GFCI is housed within an explosion proof enclosure that does not provide easy access to its contents. Alternatively, explosion proof ground fault control stations may be provided to enable testing of the GFCI, with each station adding cost to the electrical control system.

By way of background, Class I locations are those in which flammable vapors and gases may be present. Class I, Division 1 locations are those in which ignitable concentrations of hazards exists under normal operation conditions and/or where hazard is caused by frequent maintenance or repair work or frequent equipment failure. Class I, Division 2 locations are those in which ignitable concentrations of hazards are handled, processed or used, but which are normally in closed containers or closed systems from which they can only escape through accidental rupture or breakdown of such containers or systems.

For arc-generating electrical equipment to be allowed in a Class I, Division 1 or Division 2 location, it must be enclosed in an explosion proof housing. An explosion proof apparatus may be defined as an apparatus enclosed in a case that is capable of withstanding an explosion of a specified gas or a vapor that may occur within it and of preventing the ignition of a specified gas or vapor surrounding the enclosure by sparks, flashes, or explosion of the gas or vapor within, and that operates at such an external temperature that a surrounding flammable atmosphere will not be ignited thereby. Further, an explosion proof enclosure must be of adequate strength and be "flame-tight."

SUMMARY

A first aspect of the disclosure is directed to a system that includes a hot wire and a neutral wire configured to establish a closed circuit between a power source and a load. The system further includes first and second transformers as well as a sensor. The first current transformer is coupled to the hot wire and is configured to introduce a first test current, with a first polarity, into the hot wire. The second current transformer is coupled to the neutral wire and configured to substantially simultaneously introduce a second test current into the neutral wire. The second test current has the same polarity as the first test current. The sensor is configured to sense an asymmetry between the first and second test currents and is further configured to cause interruption of the closed circuit upon sensing the asymmetry.

Another aspect of the disclosure is directed to a method. The method comprises: (1) introducing a first test current into a hot wire of a closed circuit, the hot wire coupled between a power source and a load; (2) introducing a second test current into a neutral wire of the closed circuit, the neutral wire coupled between the power source and the load; (3) sensing an asymmetry between the first and second test currents; and (4) opening the closed circuit in response to sensing the asymmetry between the first and second test currents. The second test current is introduced at substantially the same time as the first test current and has the same polarity as the first test current.

Yet another aspect of the disclosure is directed to a system having a hot wire and a neutral that are configured to establish a closed circuit between a power source and a load. The system additionally includes a ground fault interrupt circuit as well as first and second current transformers. The ground fault interrupt circuit includes a sensor that is configured to continuously monitor the currents flowing in the hot wire and the neutral wire. The ground fault interrupt circuit is configured to open the closed circuit if the current in the hot and neutral wire are not substantially equal in magnitude. The first current transformer is coupled to the hot wire and is configured to introduce a first test current, having a first polarity, into the hot wire. The second current transformer is coupled to the neutral wire and is configured to, substantially simultaneously, introduce a second test current, having the same polarity as the first test current, into the neutral wire. The sensor of the ground fault interrupt circuit is additionally configured to detect an asymmetry in the waveforms of the first and second test currents. The ground fault interrupt circuit is additionally configured to open the closed circuit upon detection of the asymmetry.

The above summary is not intended to describe each embodiment or every implementation. A more complete understanding will become apparent and appreciated by referring to the following detailed description and claims in conjunction with the accompanying drawings.

DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure is directed to a system and method for automating the testing of ground fault current interrupters (GFCIs). The system and method are particularly suited to industrial environments and, even more particularly so, to Class I, Division 1 or Division 2 environments, where GFCI test circuitry is maintained behind the door of an enclosure or within an accessible but costly ground fault control station. The system and method of the present disclosure may be implemented through the use of wireless controls that will be described in further detail below.

Figure 1:
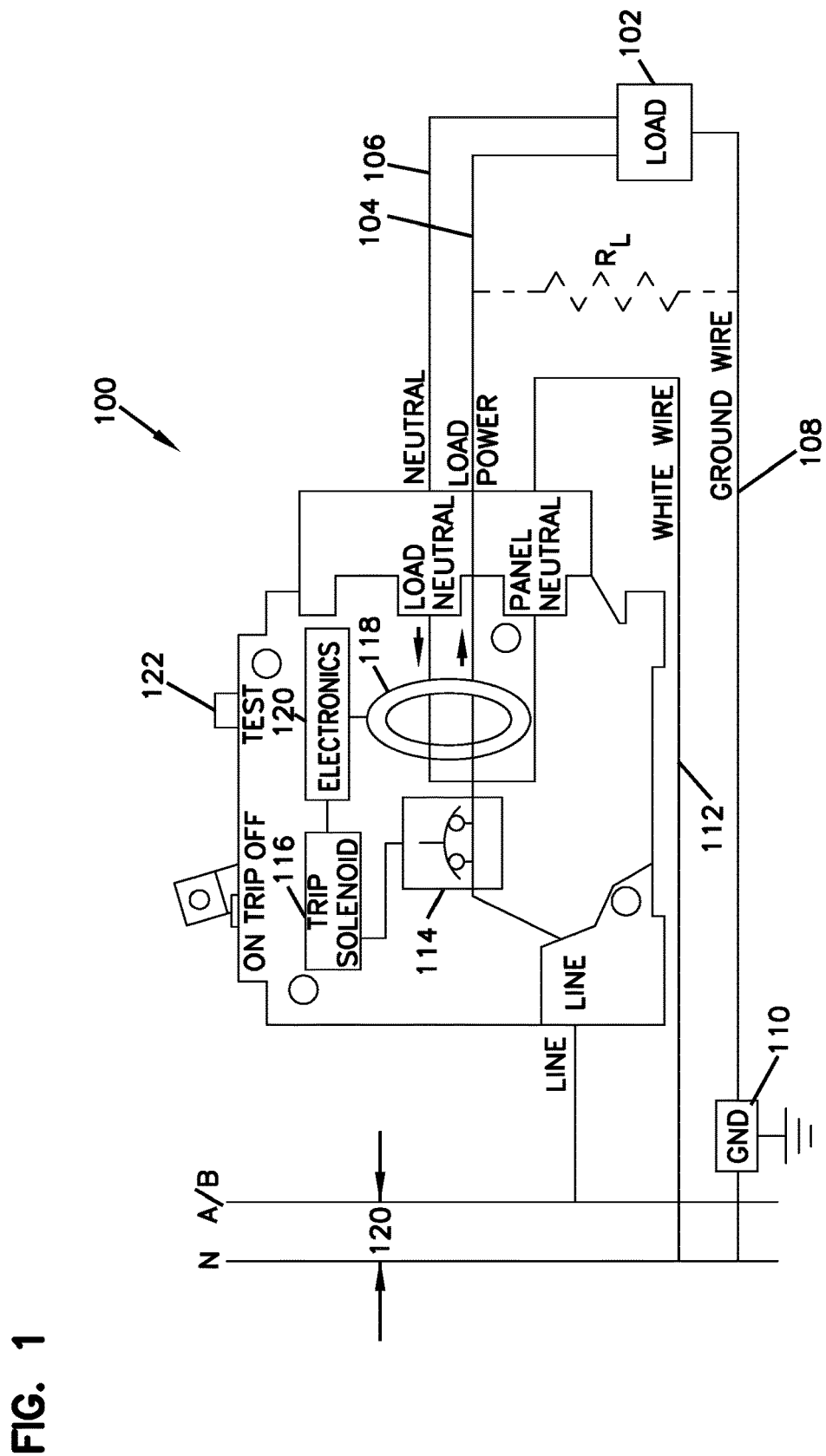
FIG. 1 is a schematic of a standard GFCI (ground fault circuit interrupt) breaker.

FIG. 1 is a schematic of a standard GFCI circuit breaker 100 that one might find in an industrial environment. As shown, the GFCI circuit breaker 100 is coupled between a line voltage A/B and a load 102 that is wired using a standard three-wire configuration of a load power ("hot") wire 104, a neutral wire 106, and groundwire 108 tied to ground 110. In this example, a fourth wire, e.g., white wire 112, is also provided to tie the neutral wire 106 to a panel neutral N, which is tied to ground 110. The GFCI circuit breaker 100 includes a standard trip mechanism 114, coupled to a trip solenoid 116, to protect the load 102 from shorts and power surges. Further, within the GFCI circuit breaker 100 are the components that comprise the actual ground fault circuit interrupter. These components include a sensing coil 118, coupled to electronic circuitry 120, to monitor the currents passing through the neutral wire 106 and the "hot" wire 104.

The neutral wire 106 and the "hot" wire 104 are passed through the sensing coil 118 so that the currents in the two wires at any instant are traveling in opposite directions, give a net zero current in the sensing coil 118 if the two currents are exactly equal. Since a current-carrying wire produces an AC magnetic field external to the wire, a non-zero current would induce a voltage in the sensing coil 118. The voltage sensed in the coil 118 is typically provided to electronic circuitry 120 where the voltage is rectified and applied to sensitive comparator to detect differences. If a difference is detected, the electronic circuitry 120 operates to activate a trip coil (not shown) which opens both the "hot" wire 104 and the neutral wire 106.

A test switch 122 is provided to test the ground fault circuit interrupter. Upon activating the switch, the "hot" wire 104 is coupled to ground through a resistive load as indicated by the dashed line incorporating the resistor $R_L$. The test should cause the ground fault circuit interrupter to trip. The ground fault circuit interrupter may then be reset for normal use.

Figure 2:
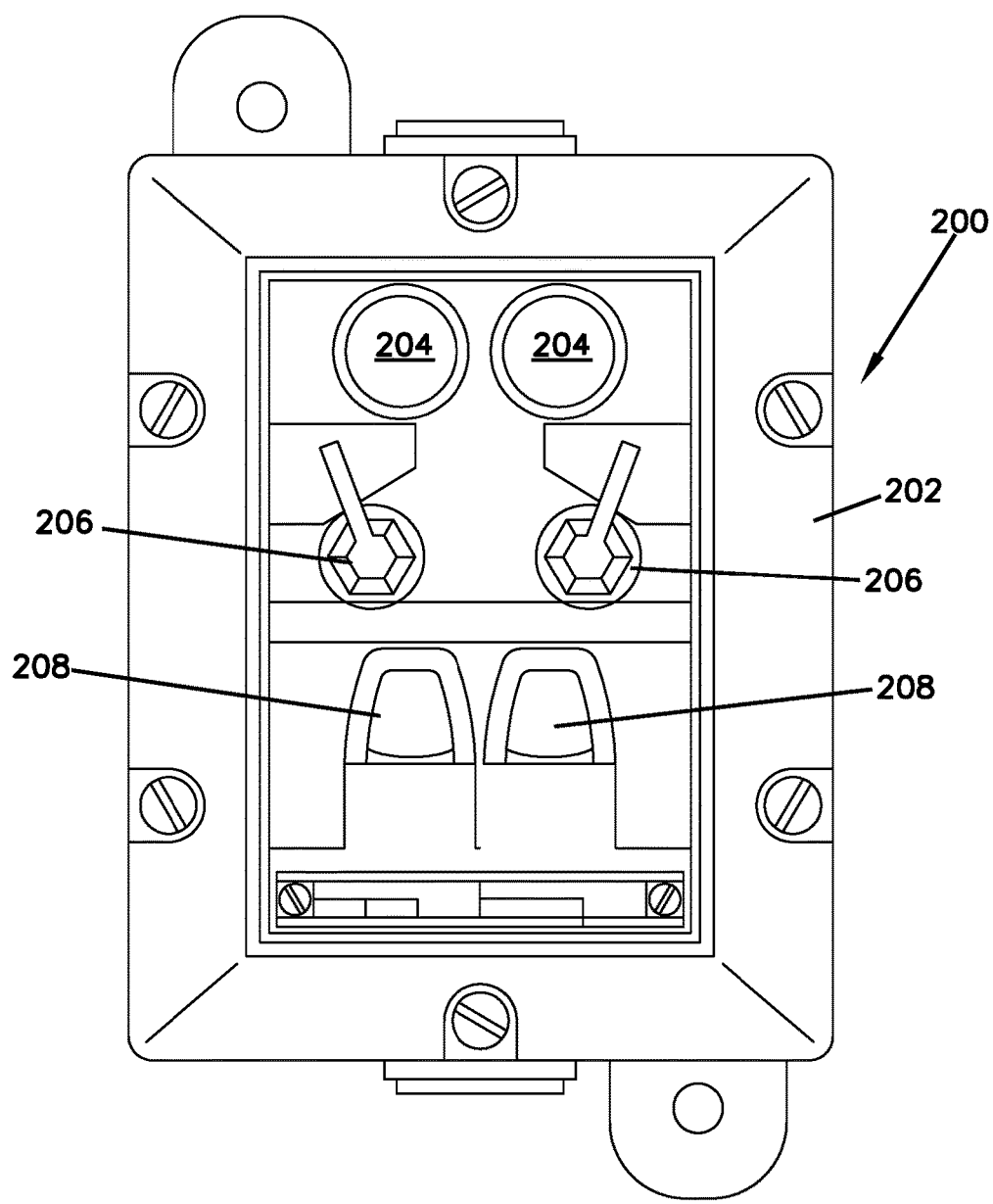
FIG. 2 is a front view of an explosion proof ground fault control station.

FIG. 2 illustrates an example of an explosion proof ground fault control station 200 configured for testing of dual GFCI circuit breakers. As illustrated, the enclosure itself is a substantial structure 202 incorporating two pilot lights 204, two operating handles 206, with positions Off/Trip/On, and two "Push to Test" buttons 208. The cost of such a structure and related controls is not insignificant and can add up quickly in application where numerous GFCI circuit breakers are needed.

Figure 3:
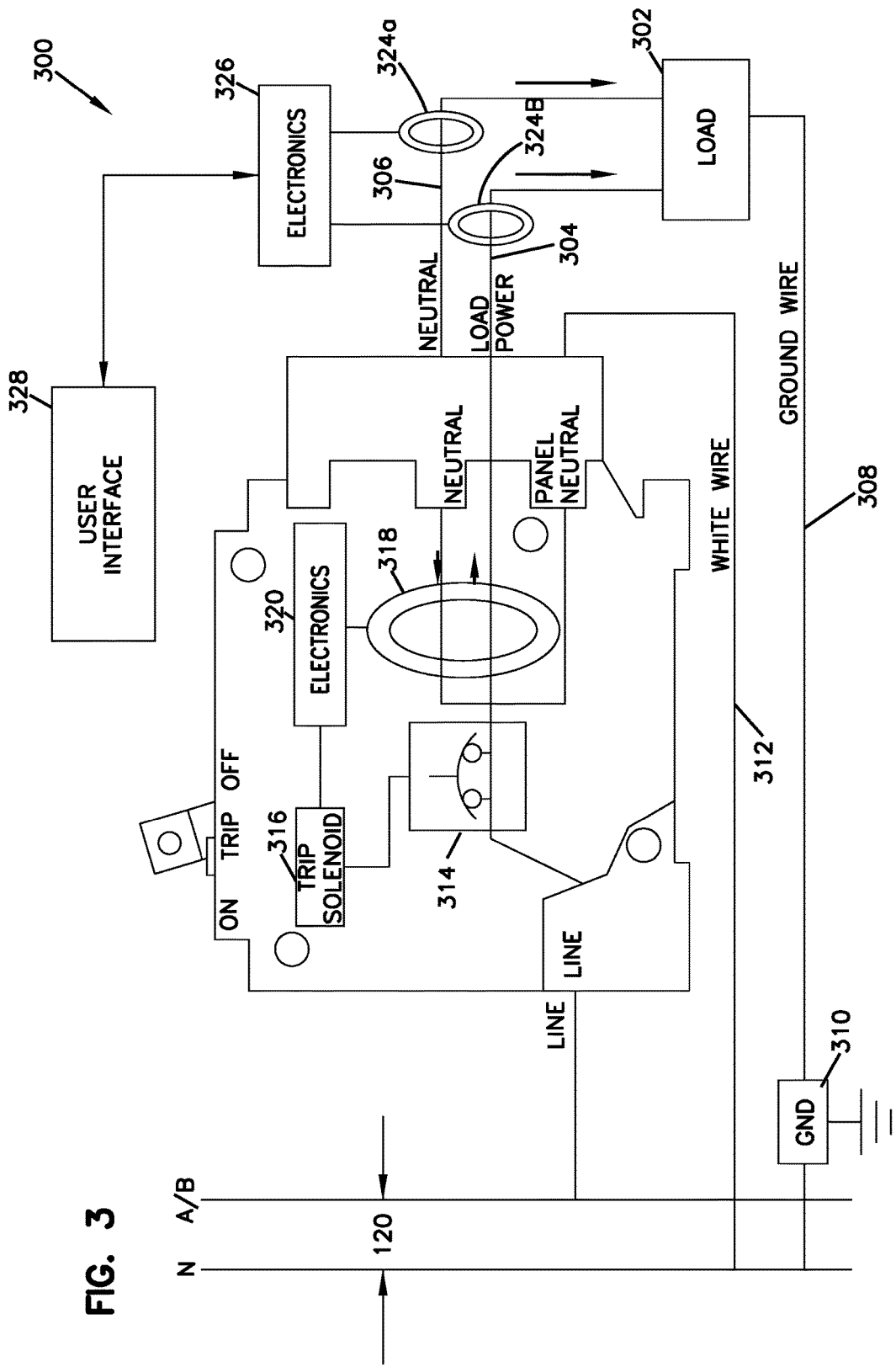
FIG. 3 is a schematic of an automated ground fault interrupt tester according to various embodiments of the disclosure.

With the above standard GFCI in mind, the present disclosure provides a scheme for automating GFCI testing and for eliminating costly ground fault control stations. More specifically, the present disclosure is directed to a GFCI breaker circuit 300, as illustrated in FIG. 3. As shown, the GFCI circuit breaker 300 is similar to the GFCI circuit breaker 100 of FIG. 1 in that the GFCI circuit breaker 300 is coupled between a line voltage A/B and a load 302 that is wired using a standard three-wire configuration of a load power ("hot") wire 304, a neutral wire 306, and groundwire 308 tied to ground 310. In this example, a fourth wire, e.g., white wire 312, is also provided to tie the neutral wire 306 to a panel neutral N, which is tied to ground 310. The GFCI circuit breaker 300 includes a standard trip mechanism 314, coupled to a trip solenoid 316, to protect the load 302 from shorts and power surges. Further, within the GFCI circuit breaker 300 are the components that comprise the actual ground fault circuit interrupter. These components include a sensing coil 318, coupled to electronic circuitry 320, to monitor the currents passing through the neutral wire 306 and the "hot" wire 304.

The neutral wire 306 and the "hot" wire 304 are passed through the sensing coil 318 so that the currents in the two wires at any instant are traveling in opposite directions, give a net zero current in the sensing coil 318 of the two currents are exactly equal. Since a current-carrying wire produces an AC magnetic field external to the wire, a non-zero current would induce a voltage in the sensing coil 318. The voltage sensed in the coil 318 is typically provided to electronic circuitry 320 where the voltage is rectified and applied to sensitive comparator to detect differences. If a difference is detected, the electronic circuitry 320 operates to activate a trip coil (not shown) which opens both the "hot" wire 304 and the neutral wire 306.

However, unique to the GFCI circuit breaker 300 is that the test switch has been eliminated and replaced with electronics 326. The electronics 326 may be incorporated into the electronics 320 or may be distinct from the electronics 320. In one example embodiment, the electronics 326 are contained within a circuit board that is mounted inside a closed enclosure and that has been configured with at least a wireless transceiver, e.g. RF, Bluetooth, etc., and a processor. The transceiver is configured to receive a signal, for example from a wireless user interface 328, indicating which GFCI circuit breaker is to be tested and to provide this information to the processor to activate the test. Notably, the test is no longer performed by coupling the "hot" wire to ground through a resistive load. Rather, current transformers 324a, 324b are coupled to the neutral wire 306 and the "hot" wire 304, respectively.

During a test of the ground fault interrupter, the processor directs that impulses of the same polarity be provided into the current transformers 324a, 324b. The impulses to the current transformers 324a, 324b will cause currents, e.g., in the 6-10 mA range, on the neutral wire 306 and the "hot" wire 304 that are flowing in the same direction, as indicated by the arrows on FIG. 3. The two currents manifest themselves as a DC shift to the load (6-10 mA will not impact the load) but present a completely asymmetrical current waveform to the sensing coil 318 causing the ground fault interrupter to trip immediately.

Figure 4:
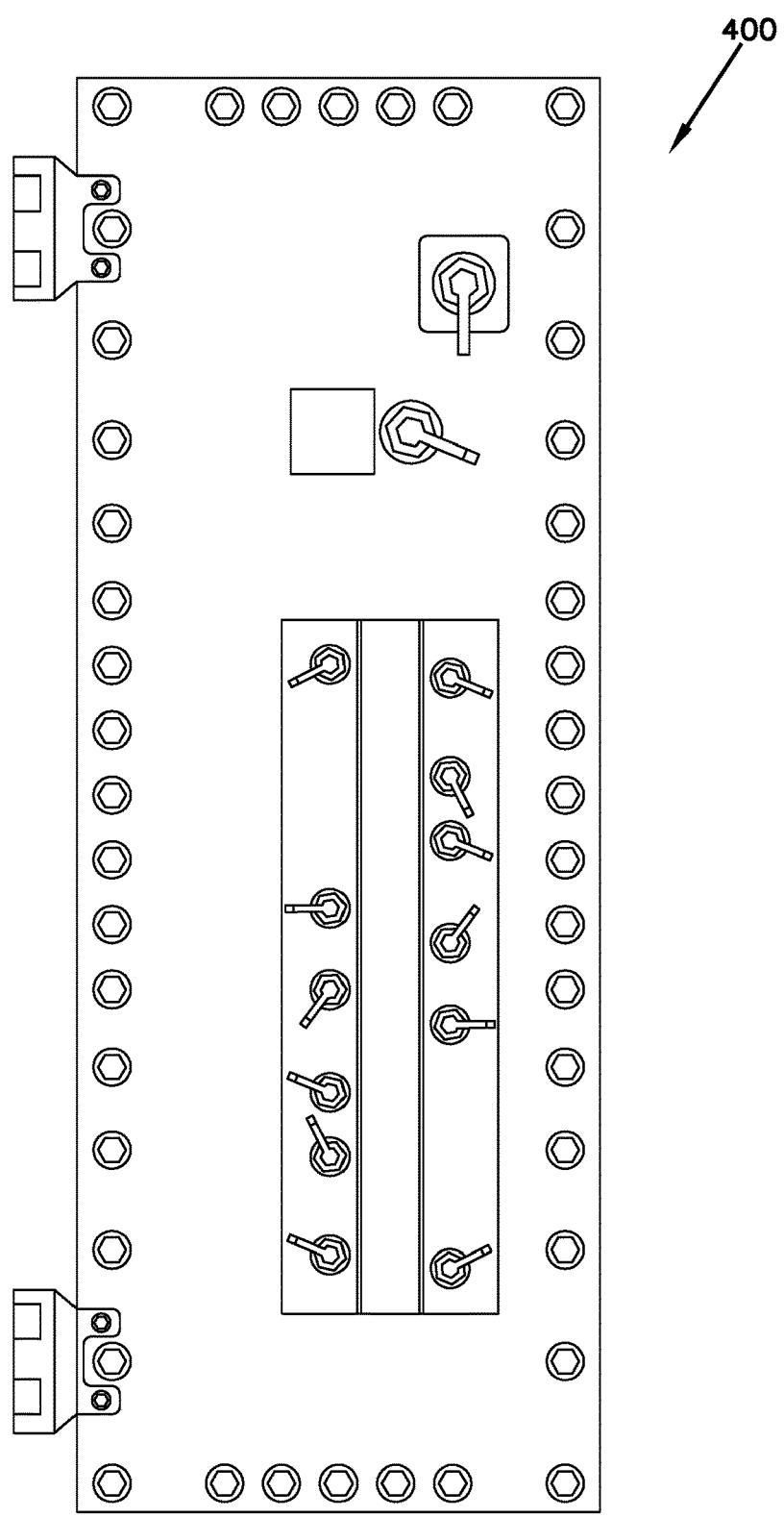
FIG. 4 is a front view of panel board the may incorporate the automated ground fault interrupt tester according to various embodiments of the disclosure.

FIG. 4 provides an example of the type of enclosure 400 that in which the automated ground fault tester of the present disclosure may be utilized. Enclosure 400 is an explosion proof circuit breaker panel board that includes a plurality of GFCI breaker circuits, each of which requires periodic maintenance testing.

The automated ground fault test system and method described herein enable the removal of pieces of equipment from the enclosure assembly, which reduces cost and labor in production of the enclosure. Additionally, by automating the GFCI testing, the exact current at which the GFCI trips can be identified. Further, by using the current transformer approach, there is no additional wire required beyond the current carrying conductors and the test circuit itself could be integrated into an existing current measurement board.

Systems, devices or methods disclosed herein may include one or more of the features, structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality.

Various modifications and additions can be made to the disclosed embodiments discussed above. Accordingly, the scope of the present disclosure should not be limited by the particular embodiments described above, but should be defined only by the claims set forth below and equivalents thereof.

What is claimed:

1. A system comprising:
   a hot wire and a neutral wire, the hot wire and the neutral wire configured to establish a closed circuit between a power source and a load;
   a first current transformer coupled to the hot wire and configured to introduce a first test current with a first polarity into the hot wire;
   a second current transformer coupled to the neutral wire and configured to substantially simultaneously introduce a second test current, having the same polarity as the first test current, into the neutral wire
   a sensor configured to sense an asymmetry between the first and second test currents and configured to cause interruption of the closed circuit upon sensing the asymmetry.

2. The system of claim 1, wherein the hot wire, neutral wire, first and second transformers, and sensor are contained within a physical-interface-free enclosure.

3. The system of claim 1, wherein the first and second current transformers are activated to introduce the first and second test currents, respectively, by a processor.

4. The system of claim 3, wherein communication is established with the processor via a user interface.

5. The system of claim 4, wherein the user interface enables a user to select from a plurality of closed circuits into which first and second test currents will be introduced.

6. The system of claim 1, wherein the first and second test currents are in the exceed 6 mA.

7. The system of claim 1, wherein the sensor comprises a sensing coil.

8. A method comprising:
   introducing a first test current into a hot wire of a closed circuit, the hot wire coupled between a power source and a load;
   introducing a second test current into a neutral wire of the closed circuit, the neutral wire coupled between the power source and the load, wherein the second test current is introduced at substantially the same time as the first test current and wherein the first and second test currents have the same polarity;
   sensing an asymmetry between the first and second test currents; and
   opening the closed circuit in response to sensing the asymmetry between the first and second test currents.

9. The method of claim 8, wherein the first test current is introduced by a first current transformer electrically coupled to the hot wire.

10. The method of claim 9, wherein the second test current is introduced by a second current transformer electrically coupled to the neutral wire.

11. The method of claim 8, further comprising initiating the introduction of the first and second test currents through a user interface.

12. The method of claim 8, wherein the first and second test currents exceed 6 mA.

13. The method of claim 8, wherein the sensing is performed by a sensor coil.

14. The method of claim 8, further comprising re-establishing the closed circuit after opening the closed circuit.

15. A system comprising:
    a hot wire and a neutral wire, the hot wire and the neutral wire configured to establish a closed circuit between a power source and a load;
    a ground fault interrupt circuit having a sensor configured to continuously monitor the currents flowing in the hot wire and the neutral wire, the ground fault interrupt circuit configured to open the closed circuit if the current in the hot and neutral wires are not substantially equal in magnitude,
    a first current transformer coupled to the hot wire and configured to introduce a first test current with a first polarity into the hot wire;
    a second current transformer coupled to the neutral wire and configured to substantially simultaneously introduce a second test current, having the same polarity as the first test current, into the neutral wire
    wherein the sensor of the ground fault interrupt circuit is additional configured to detect an asymmetry in the waveforms of the first and second test currents, and wherein the ground fault interrupt circuit is additionally configured to open the closed circuit upon detection of the asymmetry.

16. The system of claim 15, wherein the sensor comprises a sensing coil.

17. The system of claim 15, wherein the first and second test currents exceed 6 mA.

18. The system of claim 15, wherein the first and second current transformers are activated to introduce the first and second test currents, respectively, by a processor.

19. The system of claim 18, wherein communication is established with the processor via a wireless user interface.

20. The system of claim 19, wherein the wireless user interface enables a user to select from a plurality of closed circuit into which first and second test currents will be introduced.

* * * * *